United States Patent
Lee

(10) Patent No.: US 8,030,190 B2
(45) Date of Patent: Oct. 4, 2011

(54) METHOD OF MANUFACTURING CRYSTALLINE SEMICONDUCTOR THIN FILM

(75) Inventor: Byoung-Su Lee, Yeosu-si (KR)

(73) Assignee: Siliconfile Technologies Inc., Seoul (KR)

( * ) Notice: Subject to any disclaimer, the term of this patent is extended or adjusted under 35 U.S.C. 154(b) by 85 days.

(21) Appl. No.: 12/668,185

(22) PCT Filed: Jul. 15, 2008

(86) PCT No.: PCT/KR2008/004145
§ 371 (c)(1),
(2), (4) Date: Jan. 7, 2010

(87) PCT Pub. No.: WO2009/014337
PCT Pub. Date: Jan. 29, 2009

(65) Prior Publication Data
US 2010/0330785 A1   Dec. 30, 2010

(30) Foreign Application Priority Data
Jul. 23, 2007   (KR) .................. 10-2007-0073304

(51) Int. Cl.
*H01L 21/20* (2006.01)
(52) U.S. Cl. ............... 438/487; 438/509; 257/E21.133
(58) Field of Classification Search .......... 438/487, 438/509; 257/E21.133
See application file for complete search history.

(56) References Cited

U.S. PATENT DOCUMENTS

| | | | |
|---|---|---|---|
| 5,868,831 A | 2/1999 | Dornberger et al. | |
| 6,350,703 B1 | 2/2002 | Sakaguchi et al. | |
| 6,747,254 B2 | 6/2004 | Kim et al. | |
| 2006/0286780 A1* | 12/2006 | Jang et al. | 438/482 |
| 2007/0065998 A1* | 3/2007 | Lee et al. | 438/166 |
| 2007/0298591 A1* | 12/2007 | Cha | 438/478 |
| 2011/0101368 A1* | 5/2011 | Im | 257/75 |

OTHER PUBLICATIONS

PCT International Search Report of International Application No. PCT/KR2008/004145.
PCT Written Opinion of the International Search Authority of International Application No. PCT/KR2008/004145.

* cited by examiner

*Primary Examiner* — Trung Q Dang
(74) *Attorney, Agent, or Firm* — Kile Park Goekjian Reed & McManus PLLC

(57) ABSTRACT

Provided is a method of manufacturing a crystalline semiconductor thin film formed on an amorphous or poly-crystalline substrate such as a glass substrate, a ceramic substrate, and a plastic substrate through induction heating using photo-charges. The method of manufacturing a crystalline semiconductor thin film includes a process of forming a low-concentration semiconductor layer on an inexpensive amorphous or poly-crystalline substrate such as a glass substrate, a ceramic substrate, and a plastic substrate and a process of crystallizing the low-concentration semiconductor layer through an induction heating manner using photo-charges. Accordingly, a low-concentration crystalline semiconductor thin film having characteristics better than those of general amorphous or poly-crystalline semiconductor thin film can be obtained by using simple processes at low production cost.

9 Claims, 3 Drawing Sheets

METHOD OF MANUFACTURING CRYSTALLINE SEMICONDUCTOR THIN FILM

BACKGROUND OF THE INVENTION

1. Field of the Invention

The present invention relates to a method of manufacturing a crystalline semiconductor thin film, and more particularly, to a method of forming a low-concentration crystalline semiconductor thin film on an amorphous substrate or a polycrystalline substrate.

2. Description of the Related Art

In general, a MOSFET adapted to a switching device includes a channel region which is converted into a conductor by controlling a gate, high-concentration electrodes (drain and source electrodes) at two sides of the switching device, a gate oxide layer, and the gate, which are formed by performing an implant process and other general semiconductor processes. The channel region is made of a low-concentration semiconductor thin film having an impurity concentration of about $10^{19}/Cm^3$ or less. The low-concentration semiconductor thin film used for forming the channel region becomes an important factor for determining switching characteristics and needs to be crystallized.

As conventional low-concentration semiconductor thin films that are made of silicon (Si), a hydrogenated amorphous silicon thin film (a-Si:H), a microcrystal silicon thin film (uc-Si), and a crystal-grown silicon thin film are mainly used.

The hydrogenated amorphous silicon thin film or the microcrystal silicon thin film (uc-Si) that are used for manufacturing a large-sized LCD has an advantage in that the thin films can be manufactured with a simple manufacturing method. However, since many defects are included in the thin film, a mobility of charges is low and a life cycle is short, so that switching characteristics of the switching device are not good. On the other hand, the crystal-grown silicon thin film that is used for manufacturing a small-sized high-image-quality LCD has an advantage in that the switching characteristics of the switching device are good due to a good mobility of charges and a long life cycle. However, the thin film has disadvantages in that the process of crystallizing silicon is complicated and a long time is taken to manufacture the crystal-grown silicon thin film.

As an example of taking all the advantages of these methods, there have been proposed methods of crystallizing a low-concentration semiconductor thin film. Various methods of crystallizing the low-concentration semiconductor thin film have been researched. As the most general method, there is a method of depositing an amorphous semiconductor thin film and performing thermal treatment. However, the method has a disadvantage in that a time for the crystallization process is too long. For example, a process of crystallizing a silicon thin film deposited on a Corning glass requires for the thermal treatment at a temperature of about 700□ for 4 or more hours. Therefore, a productivity of the low-concentration crystalline silicon thin film is very lowered.

As another example, there is an MIC (metal induced crystallization) method. In the MIC method, silicon is deposited on a thin metal layer made of aluminum (Al), nickel (Ni), or the like, and after that, thermal treatment is performed at a temperature of 450□ or less, so that the metal elements and the silicon are dislocated and the silicon is crystallized. Since the method utilizes low-temperature thermal treatment, the method has an advantage in that limitation to a material for an underlying substrate is alleviated. However, since many metal impurities are included in the crystallized silicon thin film, the method has a disadvantage in that characteristics of devices deteriorate.

As still another example, there is a method of crystallizing an amorphous silicon layer through an induction heating process.

FIG. 1 illustrates a general method for manufacturing a crystalline semiconductor thin film through an induction heating process. Now, the method of crystallizing an amorphous silicon layer through the induction heating process will be described in brief with reference to FIG. 1.

Firstly, a diffusion barrier 120 and an amorphous silicon layer 130 are formed on an upper portion of a substrate 110. The amorphous silicon 130 is disposed under an induction coil 152. Next, an alternating current generated by a current generator 151 is applied to flow through the induction coil 152, so that an alternating magnetic field affects the amorphous silicon layer 130.

Carriers in a portion (b) of the amorphous silicon layer 130 under the induction coil are rotated by the alternating magnetic field, so that Ohmic Heating occurs. Therefore, the portion (b) is changed into a fluid state, and the fluid-state portion is crystallized in an interface (d) between the portion (b) and solid-state portions (a) and (c) by using the solid-state portions (a) and (c) as a seed. Next, the amorphous silicon layer 130 is moved in a specific direction (e), and thus, the other portion (c) is crystallized.

Since the heat generated in the inductively heated portion depends on the number of carriers such as free electrons, the method can be adapted to a silicon thin film having a high impurity concentration. However, since a low-concentration semiconductor thin film used for manufacturing a switching device has a relatively small number of carriers, the method has a disadvantage in that the method cannot be adapted to the low-concentration semiconductor thin film. Therefore, in order to form a low-concentration crystalline semiconductor thin film by using the method, a separate process of reducing the impurity concentration is needed after the high-concentration semiconductor thin film is crystallized.

In order to crystallize the low-concentration semiconductor thin film through the induction heating, there is needed a pre-heating process for increasing a temperature of the low-concentration semiconductor thin film up to a high temperature so as to generate a sufficient number of thermal electrons. The generated thermal electrons are used as carriers for the induction heating. However, since the temperature of the pre-heating is increased as the impurity concentration of the semiconductor thin film is decreased. Therefore, there is a limitation to a type of material for the underlying substrate used for the serialization of the low-concentration semiconductor thin film.

SUMMARY OF THE INVENTION

The present invention relates to a method a crystalline low-concentration semiconductor thin film through induction heating of photo-charges generated by an external light source without a separate pre-heating process.

According to an aspect of the present invention, there is provided a method of manufacturing a crystalline semiconductor thin film, the method comprising steps of: (a) forming a low-concentration semiconductor layer on a substrate; (b) generating a photo-charges by illuminating the low-concentration semiconductor layer with light; and (c) crystallizing the low-concentration semiconductor layer by performing induction heating on the low-concentration semiconductor layer.

DETAILED DESCRIPTION OF THE INVENTION

Hereinafter, embodiments of the present invention will be described in detail with reference the accompanying drawings.

Figure 1:
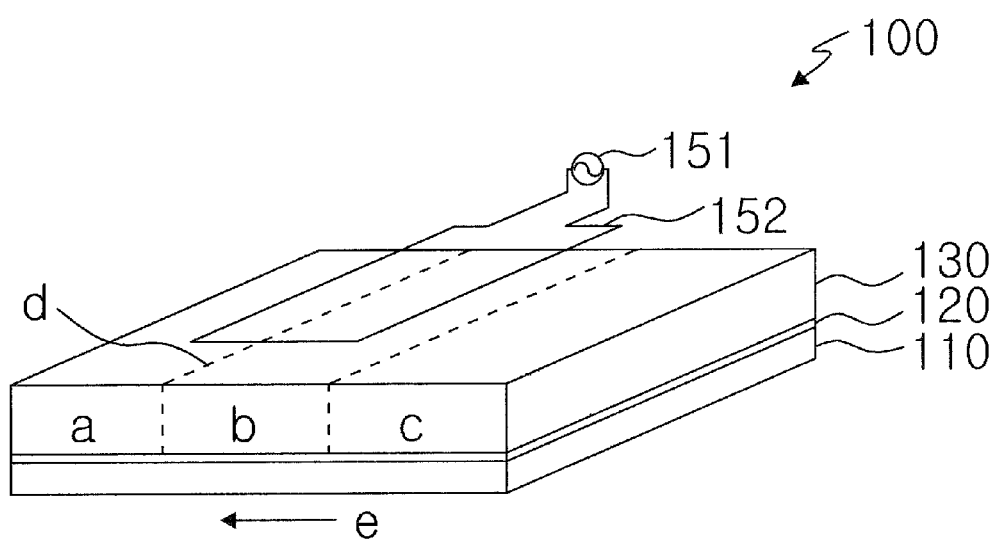
FIG. 1 is a view illustrating processes for manufacturing a crystalline semiconductor thin film by using a general induction heating method.
Figure 2:
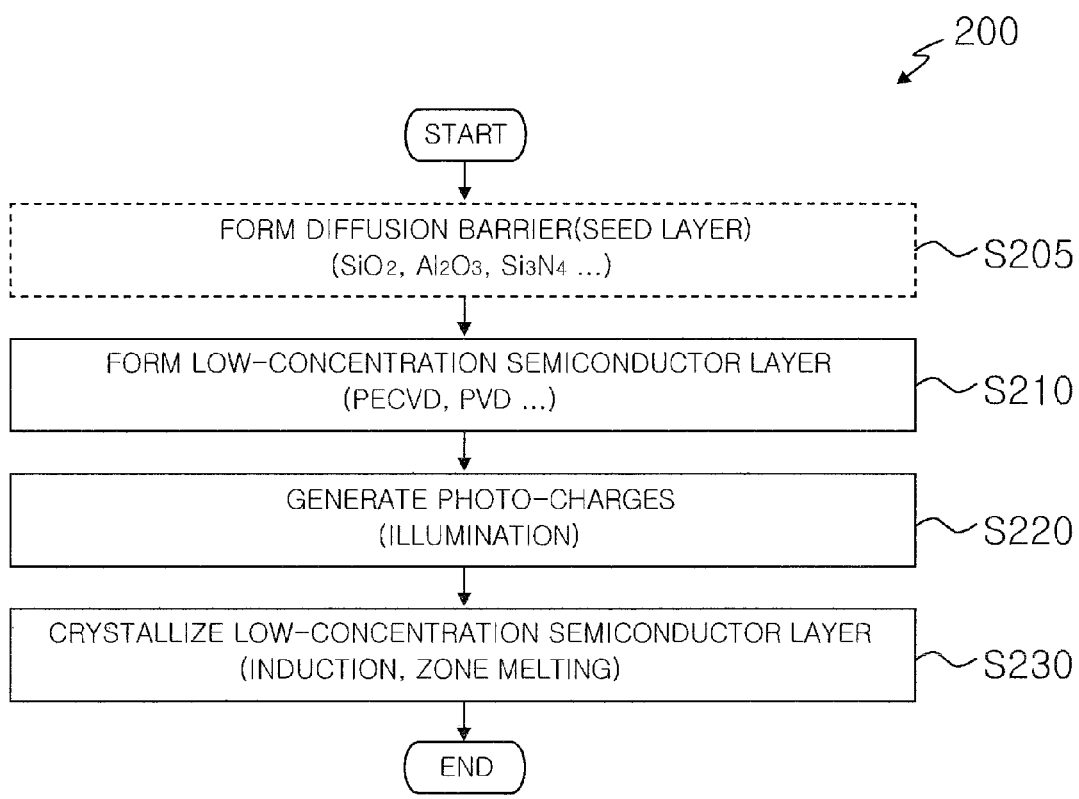
FIG. 2 is a flowchart illustrating a method of manufacturing a crystalline semiconductor thin film according to an embodiment of the present invention.

FIG. 2 is a flowchart illustrating a method of manufacturing a crystalline semiconductor thin film according to an embodiment of the present invention. The method 200 of manufacturing the crystalline semiconductor thin film according the present invention includes a low-concentration semiconductor layer formation step S210, a photo-charge generation step S220, a low-concentration semiconductor layer crystallization step S230.

Figure 3:
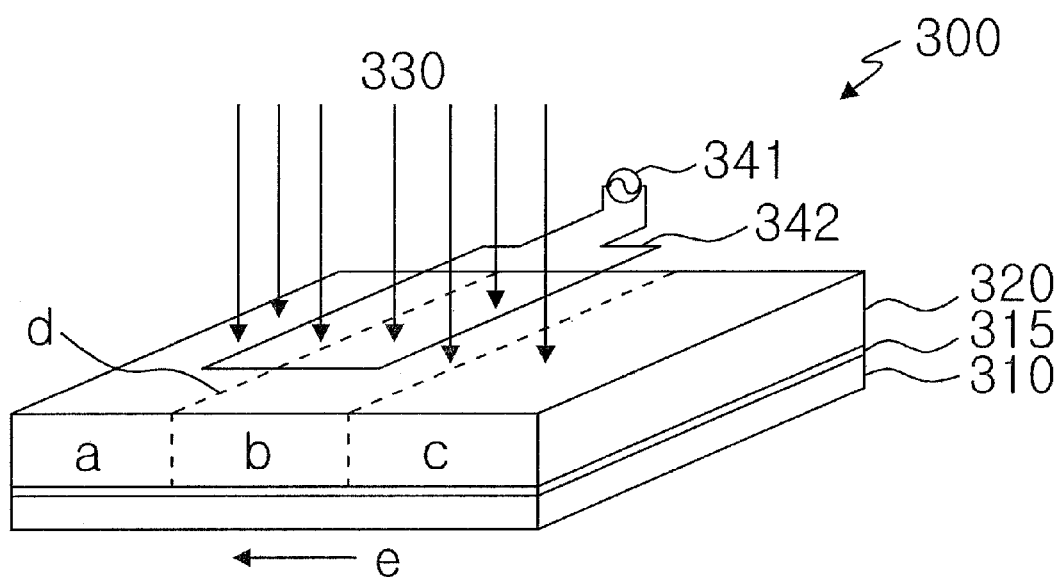
FIG. 3 is a view illustrating an example of an induction heating process using photo-charges in the method of manufacturing a crystalline semiconductor thin film shown in FIG. 2.

FIG. 3 is a view illustrating an example of an induction heating process using photo-charges in the method of manufacturing a crystalline semiconductor thin film shown in FIG. 2. The method 200 of manufacturing a crystalline semiconductor thin film shown in FIG. 2 will be described with reference to the example 300 of the induction heating process using photo-charges shown in FIG. 3.

Low-Concentration Semiconductor Layer Formation Step.

In the low-concentration semiconductor layer formation step S210, a low-concentration semiconductor layer 320 containing impurities of $10^{14}/Cm^3$ to $10^{19}/Cm^3$ is formed on an upper portion of a substrate 310 by using a PECVD (Plasma-Enhanced Chemical Vapor Deposition) method or a PVD (Physical Vapor Deposition) method such as an e-beam evaporation method and a sputtering method. Hereinafter, a "low-concentration semiconductor layer" denotes a semiconductor layer containing impurities of $10^{14}/Cm^3$ to $10^{19}/Cm^3$. The low-concentration semiconductor layer 320 may include silicon as a main component as well known.

In general, the substrate 310 may be a single-crystalline silicon substrate. Since the substrate 310 is not a portion that is directly used for manufacturing semiconductor devices such as switching devices, a low-price amorphous or poly-crystalline substrate such as a glass substrate, a plastic substrate, and a ceramic substrate can be used as the substrate 310.

A step S205 of forming a diffusion barrier 315 may be further included before the low-concentration semiconductor layer 320 is formed on the upper portion of the substrate 310. The diffusion barrier 315 can be usefully functioned in a case where the substrate 310 has a poly-crystalline structure or a case where components of the substrate 310 may be diffused into the low-concentration semiconductor layer 320. For example, in a case where a soda lime glass is used as the substrate 310, sodium (Na) components of the soda lime glass may be diffused into the low-concentration semiconductor layer 320, and thus, device characteristics may deteriorate. Therefore, a diffusion barrier 315 of $Al_2O_3$ may be formed with a thickness of about 50 nm, so that the components of the substrate 310 are prevented from being diffused into the low-concentration semiconductor layer 320.

The diffusion barrier 315 may be made of an oxide such as $SiO_2$, $Al_2O_3$, $Y_2O_3$, $ZrO_2$, $HfO_2$, SrO, $TiO_2$, $Ta_2O_5$, ZnO, $In_2O_3$, MgO, $Fe_2O_3$, and $SrTiO_3$ or a nitride such as AlN, GaN, InN, $Si_3N_4$, and TiN. The oxide may include Lanthanum oxide such as $La_2O_3$, $Lu_2O_3$, $CeO_2$, $Dy_2O_3$, $Eu_2O_3$, $Ho_2O_3$, and $Er_2O_3$.

The low-concentration semiconductor layer 320 formed in the low-concentration semiconductor layer formation step S210 has an amorphous structure or a poly-crystalline structure such as a nano-crystalline structure. In order to use the low-concentration semiconductor layer 320 for a process of forming a semiconductor device such as a switching device, there is a need for a crystallization process for re-crystallizing the amorphous or poly-crystalline low-concentration silicon layer 320 at a high temperature. Accordingly, the present invention includes a photo-charge generation step S220 and a low-concentration silicon layer crystallization step S230.

Photo-Charge Generation Step

In the photo-charge generation step S220, the low-concentration semiconductor layer 320 is illuminated with light (330) to generate electron-hole pairs on a surface of the low-concentration semiconductor layer 320. The electron-hole pairs generated by the light illumination 330 are referred to as photo-charges.

In the later-described low-concentration semiconductor layer crystallization step S320, the low-concentration semiconductor layer 320 is inductively heated through motion of carriers such as free electrons and, after that, the crystallization is performed. However, since the low-concentration semiconductor layer 320 does not have enough carriers to inductively heat, the photo-charges need to be generated so as to increase the number of carriers.

The illuminated light is selected according to the energy gap of the low-concentration semiconductor layer 320. For example, in a case where the low-concentration semiconductor layer 320 is made of the amorphous silicon, visible light in an energy range of about 1.8 eV to 3.0 eV corresponding to red to blue visible light can be illuminated. In this wavelength range, an absorbance of the amorphous silicon is about 20 or more times larger than that of the crystalline silicon. Therefore, if the light in the above energy range is illuminated on the amorphous silicon, many photo-charges are to be generated on the surface of the amorphous silicon.

The number of photo-charges increases in proportion to illumination time and intensity of light. As the illumination time of light is longer and the intensity of light is higher, the number of photo-charges increases. Therefore, the generated photo-charges become the carriers enough for the induction heating in the later-described low-concentration semiconductor layer crystallization step S230.

Low-Concentration Semiconductor Layer Crystallization Step

In the low-concentration semiconductor layer crystallization step S230, the low-concentration semiconductor layer 320 is inductively heated, and after that, the low-concentration semiconductor layer 320 is crystallized.

If there is no photo-charge generation step S220, only a small number of thermal electrons generated by heat exist on the low-concentration semiconductor layer 320. In the room temperature, electrons and holes with concentrations of about $10^{15}/Cm^3$ exist. Therefore, since a very small amount of current is induced by an alternating magnetic field, a very small amount of heat is generated by Ohmic heating. Although an external heat source can be used to heat the low-concentration semiconductor layer 320 in order to increase a density of thermal charges, there is a problem in that the underlying substrate 310 is also heat. Accordingly, if the photo-charges are generated by light illumination 330, a large number of carriers required for the induction heating can be obtained without an increase in temperature of the substrate 310 underlying the low-concentration semiconductor layer 320.

Detailed processes of the low-concentration semiconductor layer crystallization step S230 are as follows.

An induction heating apparatus includes a current generator 341 for supplying an alternating current and an induction coil 342 for inducing the alternating current. When the alternating current supplied by the current generator 341 is induced to the induction coil 342, the induction coil 342 generates an alternating magnetic field due to the alternating current which is flowing the induction coil 342. The alternating magnetic field acts on the low-concentration semiconductor layer 320 under the induction coil 342.

The electrons and the holes of the electron-hole pairs are accelerated in the opposite directions by an external alternating magnetic field. The electrons and the holes that are accelerated in the opposite direction are to rotate under the external magnetic field. A portion (b) underlying the induction coil 342 of the low-concentration semiconductor layer 320 is subject to Ohmic heating by the photo-charges rotating under the alternating magnetic field.

A temperature of the portion (b) underlying the induction coil 342 increases over a melting point by the Ohmic heating using the photo-charges, so that the portion (b) is changed into a fluid state, and after that, the fluid-state portion is to be crystallized. When the substrate 310 on which the low-concentration semiconductor layer 320 is formed is moved in a specific direction (e), the portion (a) passing through the induction coil 342 is crystallized to be changed into a solid state below the melting point. The crystallization of the low-concentration semiconductor layer 320 is performed in an interface (d) between the fluid-state portion (b) and the other solid-state portions (a, c) by using the solid-state portions as a seed.

In a case where the aforementioned diffusion barrier 315 of $SiO_2$, $Al_2O_3$, $Si_3N_4$, or the like is formed before the formation of the low-concentration semiconductor layer 320, the diffusion barrier 315 can be used as a seed. Therefore, the crystallization of the low-concentration semiconductor layer 320 is performed in the interface (d) between the fluid-state portion (b) and the other solid-state portions (a) and (c) by using the diffusion barrier 315 as a seed. For example, in a case where the substrate 310 is made of a glass and the low-concentration semiconductor layer 320 is made of silicon, if the diffusion barrier 315 made of $\beta$-$Al_2O_3$ is formed on the upper portion of the substrate 310, the component $\beta$-$Al_2O_3$ can be used as a seed for the crystallization of the silicon.

The crystallization of the low-concentration semiconductor layer 320 can be sequentially performed on arbitrarily divided regions ((a)→(b)→(c)) along the specific direction (e) from the one side to the other side of the low-concentration semiconductor layer 320. More specifically, when the crystallization of the portion (a) is completed, the photo-charges are generated in the portion (b), and the crystallization thereof is performed. When the crystallization of the portion (b) is completed, the photo-charges are generated in the portion (c), and the crystallization thereof is performed.

In the crystallization process, the substrate 310 can be maintained in a suitably low temperature. For example, if the substrate 310 is made of a glass, that is, an insulator, no current is induced on the substrate 310 in the low-concentration semiconductor layer crystallization step S230, and thus, no heat is generated by the induction heating. Since heat flows into the substrate 310 through only thermal contact between the substrate 310 and the low-concentration semiconductor layer 320, the substrate 310 can be maintained at a low temperature by adjusting an intensity of illumination light, an intensity of the current flowing the induction coil 342, and the moving speed of the substrate 310. Accordingly, only the low-concentration semiconductor layer 320 can be selectively melted without influence to the substrate 310 underlying the low-concentration semiconductor layer 320.

Although the photo-charge generation step S220 and the low-concentration semiconductor layer crystallization step S230 are separately illustrated in FIG. 2 so as to clarify that the crystallization of the low-concentration semiconductor layer 320 is performed by the induction heating using the photo-charges, the alternating current is applied to the induction coil 342 so as to crystallize the low-concentration semiconductor layer 320 in the state that the illumination 330 for generating the photo-charges is performed, and the light illumination 330 is also continuously performed in the state the alternating current is applied to the induction coil 342.

As described above, in the photo-charge generation step S220, the electron-hole pairs are generated on a surface of the low-concentration semiconductor layer 320 by the light illumination 330, and in the low-concentration semiconductor layer crystallization step S230, the electrons and the holes of the electron-hole pairs are separated from each other and rotated by the alternating magnetic field, so that heat is generated. Therefore, in the method of manufacturing according to the present invention, since the poly-crystalline low-concentration semiconductor thin film can be manufactured through the aforementioned simple processes, a separate process for reducing a concentration of impurities after crystallization of a conventional high-concentration semiconductor thin film can be omitted.

In addition, since the induction coil 342 can be manufactured with a large length, a crystalline low-concentration semiconductor thin film having a large area can be manufactured in a short time with low-cost processes.

In the method of manufacturing a crystalline semiconductor thin film according to the present invention, since the photo-charges are generated on the low-concentration semiconductor layer through the light illumination, a nearly-single-crystalline low-concentration semiconductor thin film can be easily obtained without a separate pre-heating process. In addition, a large-sized re-crystallized low-concentration semiconductor thin film can be obtained in a short time by using an inexpensive process.

In addition, in the method of manufacturing a crystalline semiconductor thin film according to the present invention, since a semiconductor layer can be crystallized without an increase in temperature of a substrate underlying the semiconductor layer, an inexpensive substrate having a low melting point such as a glass substrate, a ceramic substrate, and a plastic substrate can be used as the underlying substrate.

In addition, since a semiconductor thin film manufactured according to the method of manufacturing a crystalline semiconductor thin film according to the present invention has a low concentration, carriers (charges) have long life time and high mobility, so that semiconductor thin film can be adapted to a switching device While the present invention has been particularly shown and described with reference to exemplary embodiments thereof, it will be understood by those skilled in the art that various changes in form and details may be made therein without departing from the spirit and scope of the present invention as defined by the appended claims.

What is claimed is:

1. A method of manufacturing a crystalline semiconductor thin film, the method comprising steps of:
   (a) forming a low-concentration semiconductor layer on a substrate;
   (b) generating photo-charges by illuminating the low-concentration semiconductor layer with light; and
   (c) crystallizing the low-concentration semiconductor layer by performing induction heating on the low-concentration semiconductor layer.

2. The method according to claim 1, wherein the step (c) comprises steps of:
   (c1) generating an alternating magnetic field on the low-concentration semiconductor layer by flowing an alternating current through an induction coil;
   (c2) accelerating the photo-charges by the generated alternating magnetic field;
   (c3) heating a portion of the low-concentration semiconductor layer underlying the induction coil due to the accelerating of the photo-charge, so that the portion is changed into a fluid state; and
   (c4) crystallizing the fluid-state portion.

3. The method according to claim 2, wherein in the step (c4), the crystallization is performed in an interface between the fluid-state portion and a solid-state portion by using a solid-state portion as a seed.

4. The method according to claim 1, wherein the low-concentration semiconductor layer contains impurities having a concentration of $10^{14}/Cm^3$ to $10^{19}/Cm^3$.

5. The method according to claim 1, wherein in the step (b), the illuminating light has an energy of 1.8 eV to 3.0 eV.

6. The method according to claim 1, wherein in the step (a), the low-concentration semiconductor layer is formed after a diffusion barrier is formed on the substrate.

7. The method according to claim 6, wherein the diffusion barrier is made of an oxide or a nitride.

8. The method according to claim 1, wherein the substrate is an amorphous substrate or a poly-crystalline substrate.

9. The method according to claim 6, wherein in the step (c), the crystallizing of the low-concentration semiconductor layer is performed by using the diffusion barrier as a seed.

* * * * *